March 24, 1970 E. E. METZGER 3,502,092

TURBULENCE AMPLIFIER AND CIRCUITS

Filed Feb. 25, 1965 4 Sheets-Sheet 1

INVENTOR
ERIC E. METZGER

BY Hurvitz & Rose
ATTORNEYS

TURBULENCE AMPLIFIER AND CIRCUITS
Filed Feb. 25, 1965 4 Sheets-Sheet 2
FIG. 3
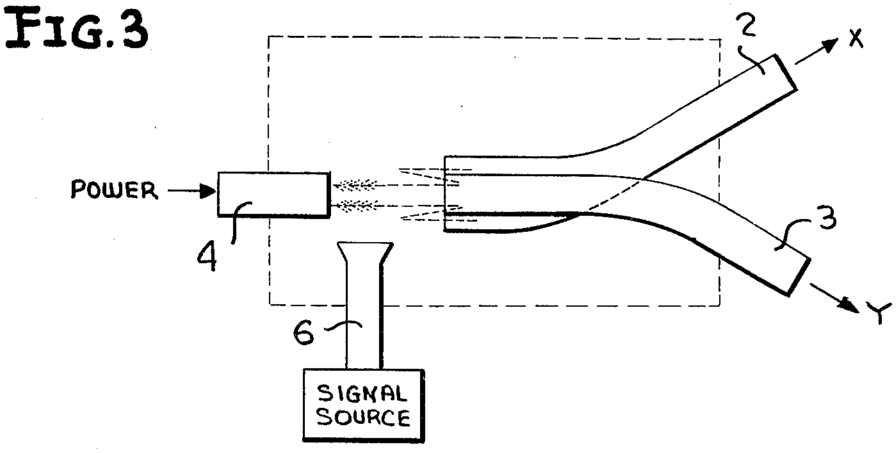
FIG. 3a
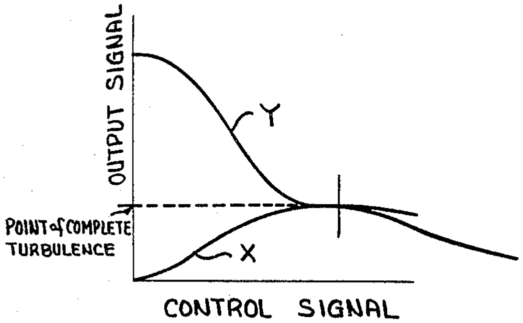
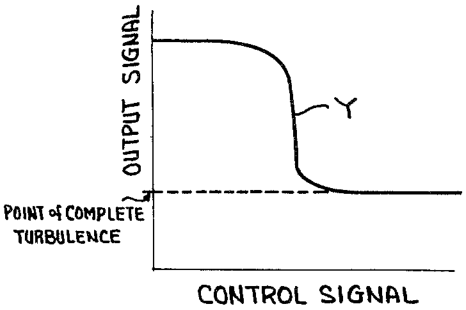
FIG. 4 FIG. 4a
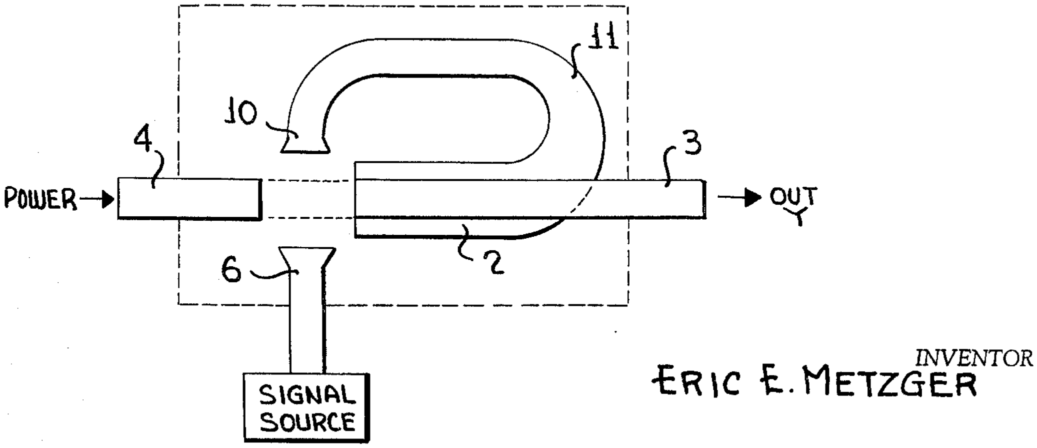
INVENTOR
ERIC E. METZGER
BY Hurvitz & Rose
ATTORNEYS March 24, 1970 E. E. METZGER 3,502,092

TURBULENCE AMPLIFIER AND CIRCUITS

Filed Feb. 25, 1965 4 Sheets-Sheet 3

INVENTOR
ERIC E. METZGER

BY Hurvitz & Rose

ATTORNEYS

TURBULENCE AMPLIFIER AND CIRCUITS

Filed Feb. 25, 1965 4 Sheets-Sheet 4

INVENTOR
ERIC E. METZGER

BY Hurvitz & Rose
ATTORNEYS

United States Patent Office 3,502,092
Patented Mar. 24, 1970

3,502,092

TURBULENCE AMPLIFIER AND CIRCUITS

Eric E. Metzger, Silver Spring, Md., assignor to Bowles Engineering Corporation, Silver Spring, Md., a corporation of Maryland Filed Feb. 25, 1965, Ser. No. 435,168
Int. Cl. F15c 1/14
U.S. Cl. 137—81.5 43 Claims

ABSTRACT OF THE DISCLOSURE

A turbulence amplifier having plural receiver ducts disposed such that power stream turbulence is manifested as a pressure differential between said ducts; an alternative feature comprises parallel disposed power and control nozzels to provide greater control over power steam turbulence; oscillators, counter stages, and logic circuits are disclosed employing one or both of the features.

The present invention relates to pure fluid elements and, more particularly, to pure fluid amplifiers of the turbulence type.

Turbulence amplifiers, in general, are well known in the art of pure fluid amplification. With a supply pressure of a few hundreds of a lb./in.$^2$ and a power nozzle about $1/25$ inch in diameter, an air operated turbulence amplifier at sea level pressure can accomplish power gains of 100 and higher. This type of amplifier device with its extremely low-operating power requirements, excellent gain, high level of amplification and many other unique properties is well suited for use in logic circuits and as a primary sensor of low velocity fluid streams and low energy acoustic waves.

In the turbulence amplifier of the type with which the present invention is concerned, a laminar power stream is developed by using a relatively long inlet tube of nozzle when the stream is at a sufficiently low velocity. With the flow being initially sufficiently laminar, the submerged power stream can be projected a distance of over one hundred times the diameter of the inlet tube or nozzle before it becomes turbulent. The eventual turbulence of the power stream is believed to result from the growth of vorticity and turbulence in the boundary layer regions of the submerged power stream as it progresses through surrounding static fluid.

In the usual turbulence amplifier, a single receiving duct is placed downstream of the power nozzle with the entrance just within the region of laminar flow of the power stream. An appreciable static pressure recovery, which is a function of the average velocity of the stream, is possible in this receiving duct and this statistic pressure constitutes the output signal of the amplifier. It is known that a relatively weak control signal from a suitably placed control nozzle will cause otherwise laminar flow in the boundary layer regions of the power stream to become turbulent at the entrance of the receiving duct. Strong mixing of the fluid in the boundary layer regions takes place, the energy initially contained within the narrow stream being distributed over a much enlarged cross-sectional area and thus the pressure signal detectable in the receiving duct is greatly reduced. As the control signal becomes stronger, the point of initial disturbance moves upstream toward the power nozzle exit and since the relative disturbance in the boundary layer regions becomes greater with increased distance of projection, the stream is distributed over even a larger area at the receiving duct entrance with the pressure signal in said receiving duct thus being further reduced.

It is desirable in many cases to use a turbulence amplifier because of its ability to detect and amplify weak control signals, such as acoustical signals. However, prior to the present invention, the used of turbulence amplifiers has been limited to application only wherein a single output signal is required. Since many pressure and acoustic detecting functions, as well as various logic functions, are better performed where plural output signals; that is, signals of the differential or alternative type, are available, there has been a need for a turbulence amplifier with plural output signal capability.

It has recently been discovered that the center portion of the power stream of a turbulence amplifier remains laminar over a range of initial disturbance in the boundary layer regions. According to the present invention, a receiving duct is positioned to receive this center portion or core of the power stream to provide an additional output signal for a turbulence amplifier. This inner receiving duct is concentric to the outer receiving duct; and is, preferably, of the same configuration, such as circular or rectangular.

In operation of the present invention, the control signal from the control nozzle determines the proportion of laminar-to-turbulent flow received by each of the receiving ducts and thus the relative or differential pressure signal at said ducts. As the level of control signal is increased the initial point of turbulence moves upstream of the power stream towards the exit of the power nozzle which results in less laminar and more turbulent flow and, thus less directed energy or pressure, being received by the receiving ducts. For example, in one embodiment where the larger duct is substantially the same size as the power nozzle, the pressure received by the larger duct will begin to fall as soon as the power stream begins to become turbulent. However, the inner duct maintains its pressure until the turbulence grows inward towards the center sufficiently to encroach on the smaller or inner duct. Then pressure at the latter begins to fall, while the pressure of the larger duct has already dropped to a lower pressure, since the fluid it receives is entirely turbulent. Thus, it can be seen that two distinct pressure signals are now available from a single turbulence amplifier; that is, one pressure signal at the outer duct, and another and different pressure signal at the inner duct.

By means of the differential output signal capability in a turbulence amplifier, I have been able to perform sensing and logic functions that were previously impossible. For example, in accordance with my invention, a maximum-minimum pressure detector is provided wherein the lower pressure limit of a norm is determined by sensing turbulence in the outer receiving duct and the upper pressure limit is determined by sensing turbulence in the inner duct. Also, a flip-flop or digital device is provided by utilizing the outer duct for feedback (through a control nozzle or a further nozzle) to the power stream to insure complete turbulence of the power stream once it starts to become turbulent due to the presence of an initially applied control signal. A variation of the flip-flop is an oscillator element wherein the flow from the inner duct is used to interrupt the feedback flow from the outer duct to temporarily restore laminar flow in the power stream. A further variation of the basic flip-flop design permits the development of a counter stage. Thus, a very versatile fluid amplifier element is provided in that it is capable of performing a wide variety of functions.

Also, according to my invention, I am able to employ the many unique advantages of a turbulence amplifer for obtaining greater efficiency in pure fluid systems. For example, such features as high amplification, acoustic disturbance-fluid pressure interface capability, low operating pressures and volumes, low condensation probability due to the low pressure drops in the element, and simplicity of design and fabrication are very important in fluid element design.

A similarly important and analogous feature of the present invention resides in the feasibility of a concentric arrangement of the control nozzle and the power nozzle of the turbulence amplifier. In one such device, the outer duct or nozzle preferably carries the power stream flow and the inner or smaller nozzle carries the control stream flow. The exit of the control nozzle is positioned upstream of the exit of the outer or power nozzle so that the control stream is completely surrounded by power stream flow as the former exits from said control nozzle. It can readily be seen that, when the control stream is completely submerged in the power stream in this manner, the entire signal flow can be utilized to control the power stream since it is impossible for any of the signal flow to escape to the surroundings. Also by encompassing the control flow within the power stream, it cannot be adversely affected by conditions external of the power stream.

In the operation of the combined control and power nozzle of the present invention, the control flow exits upstream of the power nozzle exit and the combined control and power stream exits from the power nozzle in laminar flow. Since the average velocity of the stream in a turbulence amplifier generally determines the amount of turbulence of the stream at the receiving duct in the absence of any outside disturbance, a variation in the velocity of the control stream flow will provide more or less average velocity of the control stream and thus more or less turbulence at the receiving duct in amplified form. A turbulence amplifier of this type but with the control and power streams interchanged is combined with a flip-flop element to provide a fluid counter stage having only one power nozzle.

It is an object of the present invention to provide a turbulence amplifier with plural output signal capability.

It is another object of this invention to provide a turbulence amplifier with plural receiving ducts for producing a differential pressure signal.

It is still another object of this invention to provide a turbulence amplifier with concentric receiving ducts for producing a differential pressure signal.

It is a further object of this invention to provide a maximum-minimum pressure detector utilizing a turbulence amplifier.

It is a further object of this invention to provide a flip-flop or digital device with memory utilizing a turbulence amplifier.

It is still a further object of this invention to provide an oscillator element utilizing a turbulence amplifier.

It is another object of this invention to provide a combined power and control nozzle for a turbulence amplifier.

It is still another object of this invention to provide a control nozzle adapted to issue the control stream submerged in the power stream.

Another object of the present invention is to provide a counter stage employing only a single turbulence amplifier.

The above and still further objects, features and advantages of the present invention will become apparent upon consideration of the following detailed description of one specific embodiment thereof, especially when taken in conjunction with the accompanying drawings, wherein:

FIGURE 1 is a schematic diagram of the turbulence amplifier of the present invention showing partial turbulence in the boundary layer regions of the power stream and FIGURE 1*a* is an illustration of the output signal level as a function of the power signal level of said amplifier while

FIGURE 3 is a schematic diagram of a modification of the turbulence amplifier of FIGURE 1 wherein the inner duct receives substantially all of the power stream flow while it is in a laminar condition and FIGURE 3*a* is an illustration of the output signal level as a function of the control signal level of said modification;

FIGURE 4 is a schematic diagram of a flip-flop device utilizing the turbulence amplifier of FIGURE 3 and FIGURE 4*a* is an illustration of the output signal level as a function of the control signal level of said device;

Figure 1:
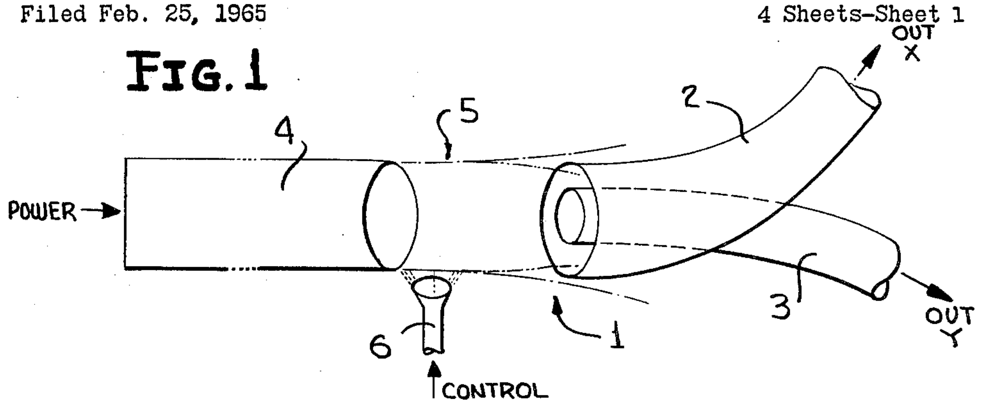

Referring now to FIGURE 1 of the accompanying drawings, there is illustrated a schematic diagram of the turbulence amplifier of the present invention, generally designated by the reference numeral 1. As previously indicated, it is an object of this invention to provide a turbulence amplifier with plural output capability. In the illustration, it can be seen that plural receiving ducts 2 and 3 have been provided in the amplifier 1 for the purpose of receiving plural pressure signals from the submerged power stream of said amplifier.

The power stream is supplied through an appropriately long and smooth-walled power nozzle 4 that develops laminar flow in the power stream so that it can be projected across the gap between the exit of the nozzle 4 and the entrance of the receiving ducts 2, 3, said gap being generally designated by the reference numeral 5. Control nozzle 6 is positioned adjacent the power stream in the gap 5 and is adapted to provide a control signal to the exposed portion of the power stream in said gap.

In the preferred operation of the device of the present invention, it is necessary to have a power stream of sufficiently low velocity that it remains in a laminar state until it is received by the entrance of the receving ducts 2, 3. To explain further, reference is made briefly to FIGURE 1*a*, which can be considered to illustrate the output pressure of either duct 2 or 3 as a function of the velocity of the power stream. From the graph, it is evident that the output pressure signal is reduced by turbulence of the power stream that begins when its velocity reaches a value designated by point A, and by the time the velocity has reached point B, complete turbulence is seen by the receiving ducts. By keeping the velocity below the point A then, the receiving ducts see laminar flow and a maximum pressure signal in the absence of a disturbance caused by a control signal.

With the ducts 2, 3 now receiving completely laminar flow, a control signal may be applied via the control nozzle 6 suitably placed near the exit of the power nozzle 4. As indicated above, the control signal can be either a low energy stream of fluid or a low energy acoustic wave. The moving molecules of the control signal, being ejected adjacent the power stream, bombard the molecules of fluid in the boundary layer region of said power stream. This disturbance increases the existing vorticity and turbulence in said boundary layer region causing the affected molecules of the power stream to fan out over a larger volume than before, as illustrated in FIGURE 1, thereby reducing the energy available at the duct 2 or ducts 2 and 3, depending upon the input signal level.

As the control signal increases in intensity, the molecules of fluid in the boundary layer regions are proportionately energized and more vigorously mixed so that the point of initial turbulence moves upstream towards the exit of the power nozzle 4. This action can be observed graphically in FIGURE 1*b*, the curve designated X representing the output signal of the outer duct 2 as a function of the control signal. As the control signal increases past point A′ on the graph, the initial point of turbulent flow moves sufficiently upstream to cause the fanned out portions to completely cover the entrance to the outer duct 2 and to begin to encroach on the inner duct 3. The inner duct curve Y follows the same pattern as outer duct curve X at higher control signal levels until the curves merge at the point B of completely turbulent flow.

Figure 1A:
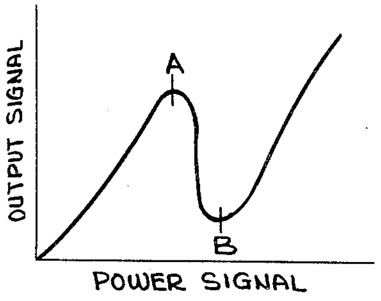

In the embodiment of FIGURE 1, the power nozzle is substantially the same size as the outer receiving duct 2 and the velocity of the power stream is selected at point A of FIGURE 1*a* so that a pressure drop will be detected at the entrance of said duct 2 as soon as a control signal appears. It should be understood, however, that the selection of the size of the receiving ducts, the velocity of the power stream, the size of the power nozzle, the length of gap 5 and the position of the control nozzle depend on many design and operating parameters and will therefore not be considered in detail here. For example, however, a nice adjustment of the hysteresis of the device; that is, the delay in control signal detection at the receiving ducts, can be accomplished by enlarging the outer duct 2 so that it receives the full fluid flow even after initial turbulence has begun or by decreasing the velocity and/or narrowing the gap 5 to produce a stream so stable that it is undisturbed at the entrance of the receiving duct during the range of control signal level to be ignored.

Reference again briefly to FIGURE 1*b*, the relationship of curves X and Y provides a differential characteristic that is adaptable to several uses of fluid amplification. In other words, over the range of control signals from O to B, a differential fluid pressure signal is provided across the output ducts and thus, this amplifier can be used in numerous applications where other conventional amplifiers are used. For example, as previously indicated, the turbulence amplifier is ideally suited to be used as a primary sensor for low energy level fluid signals, but until this invention, it has not been possible to detect a variation in control signal energy over a range of signals since only one output signal could be generated by the old amplifier. Thus, the device of the present invention can be used as a maximum-minimum signal detector system which detects a variation in fluid pressure or acoustical signal from a dead band range or norm and will now be described.

Figure 2:
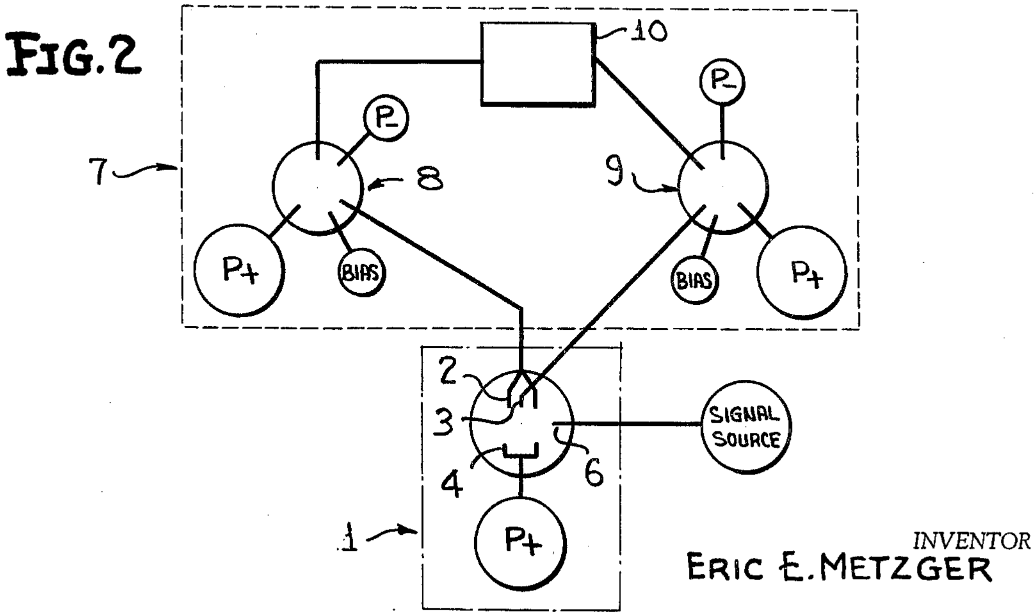
FIGURE 2 is a schematic diagram of the maximum-minimum pressure band detector according to the present invention.

As illustrated in FIGURE 2, the turbulence amplifier 1 of the present invention is employed in a maximum-minimum detector system and has outer and inner receiving ducts 2 and 3, respectively, a power nozzle 4 substantially the same size as duct 2, and a control nozzle 6. This single pure fluid element forms the heart of the signal detecting system, producing a selected output signal in duct 2 at a minimum signal level and another selected output signal in duct 3 at the maximum signal level.

This may be more fully understood by referring back to FIGURE 1*b* and the description of the operation of the device given above. For example, assume that it is desired to detect and amplify maximum and minimum control signals A′, A″ on opposite sides of control signal A. In this case then, by referring to curves X and Y, it can be seen that the corresponding critical output signal is indicated by reference numeral E which can be sensed by a control circuit.

The control circuit, generally designated by reference numeral 7 in FIGURE 2 is provided to receive the output signals from the amplifier 1, determine the relationship of said signals to the critical signal, and either count or activate a mechanism to return some parameter to proper value upon detection. This control circuit 7 is fully described in the co-pending application of Bauer, Ser. No. 370,160 filed May 26, 1964, now Patent 3,340,885, and assigned to the present assignee and consequently will be alluded to here only briefly.

The plural output signals are fed via the receiving ducts 2, 3 to digital amplifiers 8, 9, respectively, which are designed to flip or switch at the selected pressure value C. As pointed out in the foregoing application, the output signals of the digital amplifiers activate an output device, generally designated by reference numeral 10, whenever the control signal from control nozzle 6 is outside the dead band range. That is, when the power stream flow in the turbulence amplifier 1 is mostly laminar due to low control signal level; that is, below level A′, the pressure in the outer receiving duct 2 will be strong enough to drive the power stream of the digital amplifier 8 into its output duct to produce an output signal at 10. On the other hand, when the control signal is sufficiently strong; that is, above level A″, to cause sufficient turbulent flow to encroach on a large portion of the inner duct 3, there will not be enough pressure in receiving duct 3 to prevent an output signal in the output duct of digital amplifier 9. At all other levels of control signal; that is, within the dead band range, the power streams of the amplifiers 8, 9 are received by dumps or vents P— and no signal is received at 10.

It should be noted that any energy range for detection can be selected in the system of the present invention by proper design of the digital amplifiers to switch at the proper critical signal. Also adjustments can be made by adjusting the level of bias to each digital amplifier, as more fully set out in the above-mentioned Bauer application.

This type of energy level detecting and measuring device is deemed to be useful in a number of applications where it is desired to set up a counter or control dependent upon the control signal being received from the signal source. For example, since aircraft engine noise is a measure of engine power level, by using the exhaust of the engine as a noise signal source, such a device could be used to measure engine operating level and maintain a desired level for autopilot operation. Also, a signal source might be an ultrasonic bath whereby the turbulence in said bath could be sensed and effectively controlled.

The turbulence amplifier of FIGURE 3 differs from that of FIGURE 1 in that the inner receiving duct 3 is substantially the same size as the power nozzle 4 so that the outer receiving duct 2 receives fluid only when turbulence is present in the power stream. In this combination, differential amplifier characteristics are created, as shown by the graphical illustration in FIGURE 3*a*; the curve designated X being the output signal of the outer duct 2 and the curve designated Y being the output signal of the inner duct 3, both as a function of the control signal.

This type of turbulence amplifier has one clear advantage in that the outer receiving duct can act as a receiver and source for a feedback loop 11, as illustrated in FIGURE 4. In this figure, the device of FIGURE 3 is employed with flow to outer duct 2 being directed by feedback loop 11 to a second control nozzle 10 located downstream of nozzle 4 preferably, though not necessarily, the same distance as nozzle 6. This arrangement insures that the amplifier will become completely turbulent as soon as turbulence is initiated and flow to passage 3 remains terminated. The flow to passage 3 is re-established by temporarily terminating flow to the power nozzle 4 which therefore also serves as a signal input. Thus, a truly digital or flip-flop device with memory is provided. As illustrated in FIGURE 4*a*, the output signal Y remains at a maximum level until the critical control signal is reached, at which point the amplifier output signal drops immediately due to the feedback signal action, which produces complete turbulence in the power stream of the amplifier.

As in the embodiment of FIGURE 1, the device of this embodiment allows the turbulence amplifier to be employed in pure fluid applications heretofore not possible. The apparatus of FIGURE 4 may, if input signals are not applied to the power nozzle be utilized as a reliable safety switch that switches once the input signal to the nozzle 6 achieves a predetermined value. The device remains in the switched position until manually reset by at least interruption of the power stream or diversion of the stream in the feedback loop 11 away from the power stream for an interval at least equal to the time constant of the loop 11, thereby allowing laminar flow to resume, the latter occurring only if the control signal has previously terminated.

Figure 5:
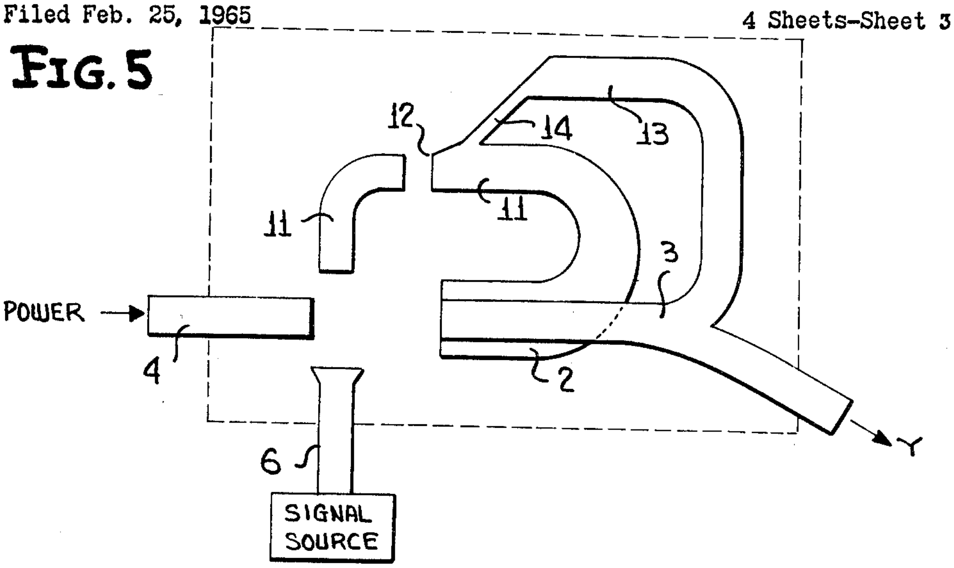
FIGURE 5 is a schematic diagram of the oscillator element utilizing the flip-flop device of FIGURE 4 in accordance with the present invention.

Referring now to FIGURE 5, an element is illustrated and described which may be employed as an oscillator or monostable flip-flop. A feedback loop 11 is provided, as in the digital device, to drive the amplifier to maximum turbulence once a control signal appears at the control nozzle 6. A gap 12 is provided in the feedback loop 11 so that a second turbulence amplifier may be provided and the feedback signal may be intermittently interrupted to produce an oscillating output signal from the inner duct 3. A second oscillator feedback loop 13 is tapped from inner duct 3 and terminates at angled wall 14 adjacent the gap 12 of the feedback loop 11 and extending between ducts 11 and 13. This portion of the drawing is in perspective to more clearly illustrate the structural relationships involved.

In operation, and assuming that the power stream is initially laminar and that the inner receiving duct 3 receives all of the power stream, a maximum signal is initially generated at duct 3 and also in the oscillator feedback loop 13. At maximum output signal the flow through the exit of said loop 13 is very stiff and leaves said exit in a straight line, ignoring the angled wall 14.

Now, assume that a signal of sufficient strength to produce some turbulent flow in the boundary layer regions of the power stream is received at the control nozzle 6. Flow to the duct 3 is reduced thereby reducing the output flow at Y while flow is established through feedback loop 11 from the outer duct 2, as more completely explained in relation to the flip-flop device of FIGURE 4. Some amount of feedback flow may be lost in the gap 12, but in any case, the amount of flow delivered to the power stream is sufficient to produce complete turbulence of the power stream thereby producing a minimum signal at Y.

Although the power stream is turbulent, some flow is delivered to the duct 3 and proceeds through the loop 13. The flow exiting from the loop 13 is no longer "stable" so that the stream may now become attached to the wall 14 by the phenomena of boundary layer lock-on. With said stream locked onto the wall 14, it cuts across the path of the feedback stream at the gap 12 in feedback loop 11 and produces turbulence of the feedback stream so as to effectively prevent interaction with the power stream of the amplifier. As a result, the power stream is allowed to return to normal laminar flow and maximum output at Y. Once the power stream is laminar, the stream velocity in loop 13 increases, it detaches from the angled wall 14 and again permits feedback flow to pass through gap 12.

As long as a control signal remains at the control nozzle 6, a small turbulence in the boundary layer regions of the power stream is always present and oscillation is realized at the duct 3 by repetition of the above operation. If a monostable flip-flop is to be provided, the control signal source 6 is pulsed.

The control signal must be of sufficient duration to permit complete turbulence of the main stream to be established. The switched condition is maintained until flow in path 13 terminates flow in path 11. Thus, by selecting the relative length of feedback paths 11 and 13, the period of the device is determined, this also determining the input pulse rate.

It is to be understood that the requirement for a control stream in the apparatus of FIGURE 5 may be eliminated when employed as an oscillator. The turbulence amplifier comprising elements 2, 3 and 4 may be designed such that the power stream has a small amount of initial turbulence by the time it reaches ducts 2 and 3. The flow in duct 13 has sufficient velocity that it cannot attach to wall 14. On the other hand, the small amount of turbulent flow in duct 11 is sufficient, in view of the high gain of turbulence amplifiers to increase the turbulence of the power stream from nozzle 4. The action is cumulative and the velocity in duct 13 falls to a point where the stream issued therefrom may attach to wall 14 and terminate the feedback signal through loop or duct 11. Initial conditions are re-established and the cycle repeats itself.

Thus, the oscillator of FIGURE 5 may be self-initiated or signal initiated. It is important to note that the delay in the feedback path 13 must be sufficient to sustain the signal diverted by wall 14 for a sufficient length of time to permit the power stream to re-establish laminar flow. There is a finite time delay between termination of the feedback signal through loop or duct 11 and re-establishment of laminar flow in the power stream. This delay, is, among other things, a function of viscosity of the fluid in the main stream and its velocity and therefore frequency of oscillation may be controlled by stream velocity and choice of the operating fluid.

Figure 6:
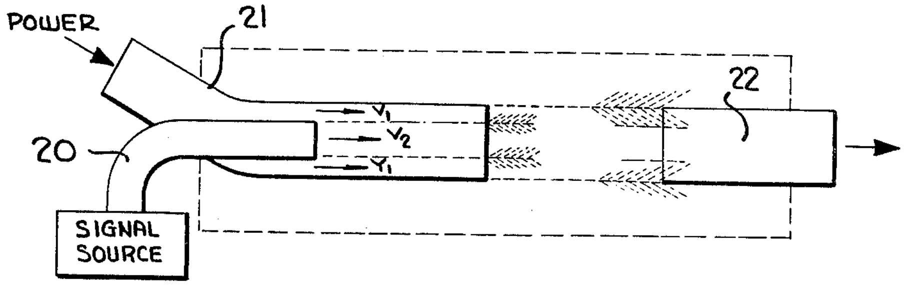
FIGURE 6 is a schematic diagram of the turbulence amplifier of the present invention illustrating the combined power and control nozzle.
Figures 7, 7A:
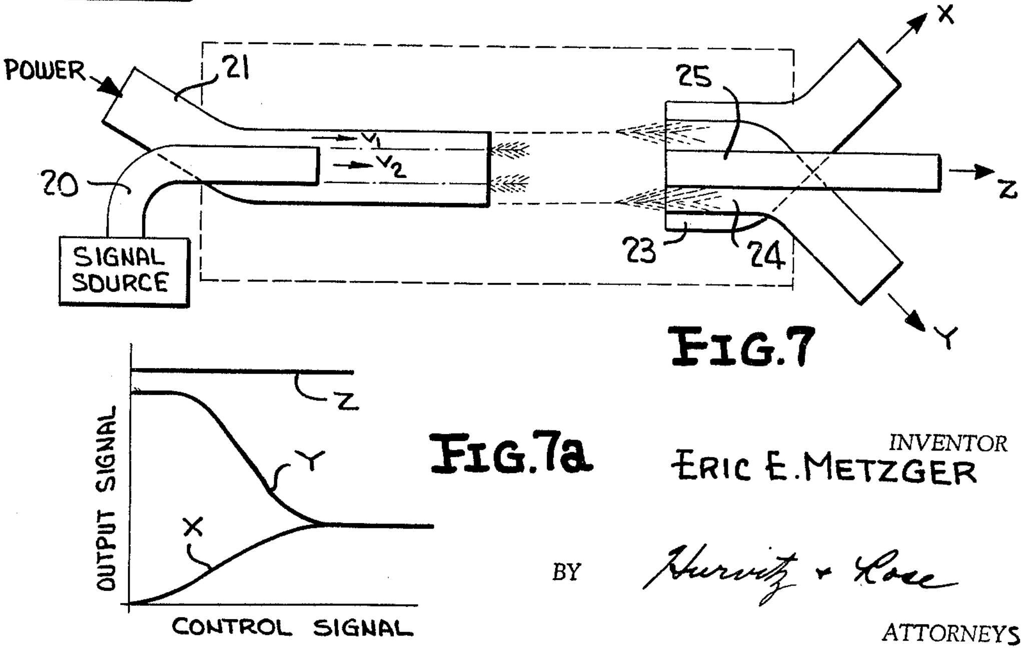
FIGURE 7 is a schematic diagram of a modification of the turbulence amplifier of FIGURE 6 showing three receiving ducts and FIGURE 7*a* is an illustration of the output signal level as a function of the control signal level of said amplifier.

With reference now to FIGURES 6 and 7 of the drawings, another important feature of the present invention is illustrated. This feature is a combined control and power nozzle wherein the control nozzle is concentric with the power nozzle.

In the embodiment of FIGURE 6, control nozzle 20 is placed within the power nozzle 21 so that the complete control stream is captured in the power stream flow. Also, as illustrated in this preferred embodiment, the exit of the inner or control nozzle is placed sufficiently upstream of the exit of the power nozzle so that it may provide complete turbulence of the power stream near the power nozzle exit, which turbulence is transferred to and amplified by the surrounding power stream flow. More particularly, turbulence of a stream is a function of the velocity of the stream relative to the velocity of an adjacent medium and it makes no difference whether this medium is external of the stream or internal thereof. In the arrangement illustrated in FIGURE 6, turbulence of the power stream may be produced at its inner periphery at the interface with the control signal issued by the control nozzle, or at the interface with the ambient atmosphere about its outer periphery. If the streams issued by the nozzles 20 and 21 are of the same velocity, then due to the basic amplifier design, no turbulence of the power stream is produced in the region between the power nozzle 21 and the receiver 22. However, if the relative velocities of the power stream and control stream issued by the nozzle 20 are sufficiently different to produce turbulence, the turbulence produced at the interface of these streams proceeds outwardly through the power stream to its outer periphery. This turbulence may proceed to the outer periphery of the control stream at any point downstream of the power nozzle 21, the point at which turbulence appears at the outer periphery of the power stream depending upon the initial degree of turbulence. If the turbulence at the interface of the two streams is sufficiently small, it may not emerge until the stream has already been received in the tube 22 in which case it has no effect upon the pressure developed in the tube 22. However, to the extent that the velocity difference between the two streams is great enough to cause the turbulence to emerge before the stream reaches the receiver tube 22, the turbulence causes spreading of the stream and therefore reduces the pressure in the tube 22. The reason for terminating the control nozzle 20 upstream of the power nozzle 21 is such that, if the difference in velocities between the two streams is great enough, then turbulence at the outer periphery of the power stream may be produced at the exit to the nozzle 21, thereby providing the entire region between the nozzle 21 and recepter 22 for the production of further turbulence to thereby produce a minimal pressure signal in the tube 22.

More specifically, a control signal is normally considered to have a particular amplitude range, in this case, range of velocities. The systems should be designed such that, at some particular velocity, for instance, a control velocity equal to the power stream velocity, the tube 22 receives a maximum pressure. At the upper or lower range of velocities of the control signal the tube 22 should receive a minimum signal. In any amplifier, it is desirable to maximize the range between minimum and maximum signal. In order to minimize the minimum signal, it is desired to provide the greatest possible distance, within the confines, of course, of a practical amplifier, between the point at which turbulence can be initiated in the power stream and the output tube 22. In the present invention by placing the egress orifice of the control nozzle 20 upstream of the power nozzle 21 by the proper distance, turbulence of the main stream, in the presence of a maximum input signal, appears at its outer periphery at the exit of the power nozzle. This is a result of the fact that where the two velocities; that is, the velocity of the power stream and the velocity of the control signal, are sufficiently different, the turbulence at the interface of the two streams is so great that the turbulence has spread from the center core of the power stream to its outer periphery in the distance from the egress orifice of the control nozzle to the egress orifice of the power nozzle. It is apparent that in the prior art turbulence amplifier such as in FIGURE 5, a maximum turbulence is not produced immediately upon exit of the power stream from its nozzle since a certain length is required for introduction of the control signal to the power stream. In the case of FIGURE 6, the turbulence produced at the interface of the two streams is amplified in proceeding through the power stream and then is further amplified due to the effects of the large difference in velocities between the power stream and the ambient fluid. Thus, a double amplification factor takes place and maximum signal reduction can be achieved over a shorter distance between the power stream and the receiving tube 22 or a larger overall amplification can be achieved for a fixed distance between these two elements.

The signal source to the control nozzle 20 can conveniently be a vortex amplifier, which is basically a velocity output device. When no vorticity exists, the flows are parallel and chosen to be of equal velocities. As vorticity begins, rotation of the inner flow produces a turbulent transition.

With reference now to FIGURE 7, there is illustrated a preferred embodiment of a differential amplifier using the combined control and power nozzle of FIGURE 6. Receiving ducts 23, 24, 25 are placed at the proper position downstream to receive the essentially laminar power stream at a selected level of control signal input. The zero signal turbulence is such that the entire power stream is accommodated by the innermost receiving ducts 24, 25 and there is no flow in the outer receiving duct 23.

Figure 1B:
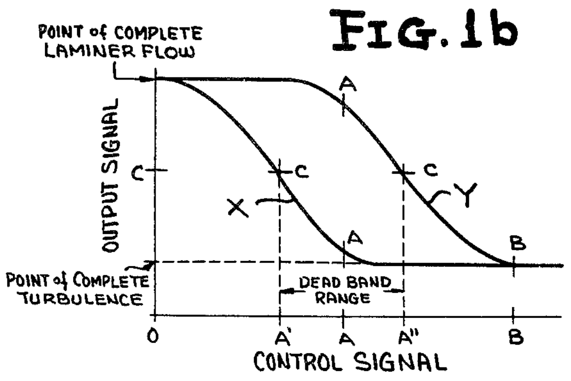
FIGURE 1*b* illustrates the output signal as a function of the control signal.

Referring now to FIGURE 7*a*, the operation of this amplifier is explained. Curve X represents the output signal at the duct 23 as a function of the control signal and curves Y and Z respectively represent the output signals for the ducts 24 and 25. An operating point has been selected so that the duct 23 receives flow when the turbulence rises and thus gains pressure, the duct 24 loses pressure when turbulence rises and the duct 25 is always retained at maximum pressure since, within the operation being described, the duct 25 does not receive turbulent flow. It is clear that other methods of setting the operating points are possible and that the relationship between pressures in ducts 24 and 25 may be as illustrated in FIGURE 1*b*.

Figure 8:
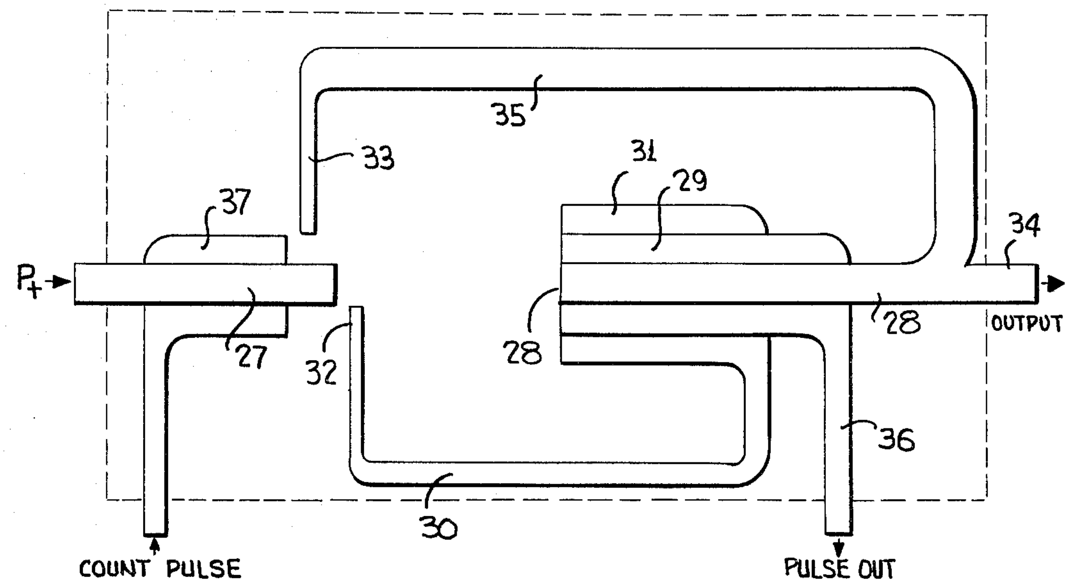
FIGURE 8 is a schematic diagram of a counter stage employing a turbulence amplifier.

Referring now specifically to FIGURE 8 of the accompanying drawings, a modified form of the amplifier of FIGURE 7 is employed to provide a counter stage. A counter stage is described as one which receives successive count pulses and produces alternate output signals into different output channels. The device is provided with a power nozzle 27 which, in the absence of control signals, issues a laminar stream received wholly by an inner receiver channel 28. The device is provided with further receiver channels 29 and 31 which are concentric with the channel 28 and form, respectively, middle and outer receiver channels. The device is provided with a first feedback nozzle 32 which is connected through a feedback path 30 to receive all the fluid diverted to the outermost receiver 31. There is also provided a second feedback nozzle 33 which is connected through a second feedback path 35 to receive a portion of the fluid directed to the channel 28. The remaining portion of the fluid directed to the channel 28 appears in a first output passage 34 whereas fluid directed to the receiver passage 29 is diverted to a second output channel 36.

Since no fluid is, at this time, applied to the nozzle 33 which directs fluid against the nozzle 27 upstream of its egress orifice, there is provided a control passage 37 concentric with the power nozzle 27 and terminating upstream of the egress orifice of the nozzle 27. The feedback nozzles 32 and 33 are at right angles to the axes of the nozzles 27 and 37, the nozzle 32 being located just downstream of the egress orifice of the nozzle 27 and the nozzle 33 being located just downstream of the control passage 37.

In operation, fluid is initially supplied to the power nozzle 27 and is received by the passage 28. This fluid proceeds to the output passage 34 and a portion is directed to the control nozzle 33. The control passage 37 is adapted to have applied thereto the count pulses, and upon receipt of the first count pulse, the fluid issuing from the count pulse control nozzle 37 is rendered turbulent by the fluid issuing from the control nozzle 33. The count pulse fluid is therefore directed to the passage 31 and this fluid proceeds to the control nozzle 32.

Upon termination of the count pulse, the power stream is rendered turbulent by control flow from passage 32 (if it had not been made turbulent previously by the turbulent control stream) and maintains a supply of fluid to the passage 31 and therefore maintains the power stream turbulent and minimizing flow to the passage 28. Therefore, the flow of fluid to the output passage 34 is minimized as is the flow of fluid to the control nozzle 33. It should be noted that the count pulse must be of sufficient length to maintain a flow of count pulse fluid to the tube or receptor 31 until fluid issues from the control passage 32 so that this condition may be maintained after termination of the count pulse.

The fluid issued from the control nozzle 37 is approximately of the same velocity as the power stream so that, upon application of the next count pulse, the count pulse flow around the power stream stills the turbulence of the power stream. More particularly, since the count pulse fluid and the power stream fluid are flowing at approximately the same velocity, the turbulence introduced by the nozzle 32 is not reenforced by the surrounding medium and is, in effect, squelched. Flow is increased to the passage 28, while flow to the passage 31 is reduced. This substantially terminates the flow from the control nozzle 32 and flow to the passage 28 is fully re-established.

It should be noted that the count pulse, however, must terminate before flow to the output passage 28 fully re-establishes flow to the control passage 33. For this reason, it will be noted that the feedback passages 30 and 35 from the receiving channels 31 and 28 are of different lengths. As was previously indicated, the count pulse must be sufficiently long to establish a flow from the control nozzle 32, and on the other hand, must be sufficiently short that it is reduced before flow is increased to the control nozzle 33 from the output passage 28. Thus, these two passages are of different lengths and permit a ready selection of a count pulse length which falls between the two feedback channel time constants.

It is apparent from the above that flow to the passage 34 is increased on every other count pulse and therefore a counter stage or divide-by-two device is provided. The flow to the passage 34 is a continuous flow when the power stream is in its laminar state. If it is desired to regenerate the original input pulse for some other application in a circuit, then the output passage 36 may be utilized. More particularly, upon establishment of an initial condition; that is, large flow to the passage 28, little fluid flows to the receiving channel 29. When the flow is in a steady state condition to the passage 31, there is little flow to the channel 29. However, when flow is switching between channel 28 and channel 31 on the one hand and between the channel 31 and the channel 28 on the other, there is a temporary or pulsed flow to receiver channel 29. Thus, not only does the count pulse produce a counter operation, the pulse also regenerates itself at each stage for subsequent use in the circuit.

Figure 9:
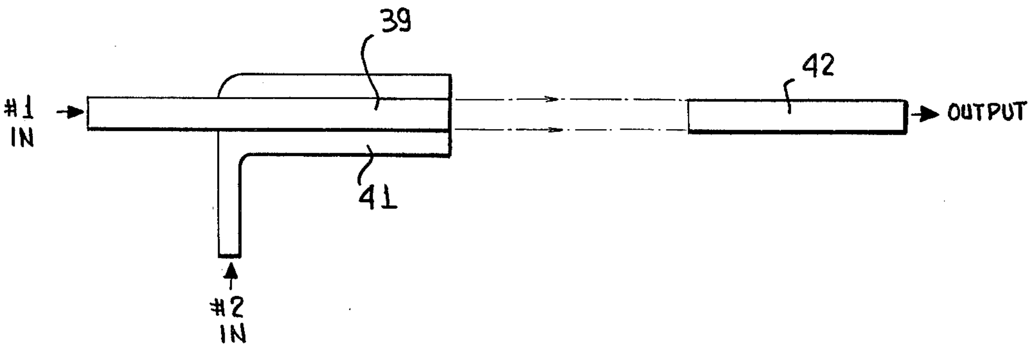
FIGURE 9 is a schematic diagram of an and or coincidence circuit.

Referring now specifically to FIGURE 9 of the accompanying drawings, there is illustrated an and gate or coincidence circuit employing concentric power streams and a single output receiving tube. A first power stream is generated by inner tube or power nozzle 39 and a second power stream is generated by an outer nozzle 41 concentric with the nozzle 39. A single output tube 42 is located downstream from the egress orifices of the nozzles 39 and 41, and is of approximately the same diameter or area and configuration as the power nozzle 39. The length or distance between the egress orifices of the tubes 39 and 41 in the ingress orifice of the output tube 42 is such that the stream issued by the nozzle 39 is completely turbulent by the time it reaches the tube 42 and thus, when only the nozzle 39 is issuing fluid, the tube 42 receives only a very small amount of fluid at a relatively low pressure. When the tube 41 is the only tube issuing fluid, it becomes turbulent also and since its hollow annulus of fluid is of a larger inner diameter than tube 42 in any event very little fluid again reaches the tube 42. However, if both of the nozzles 39 and 41 issue fluid, then the outer annulus of fluid issued by the nozzle 41 protects the inner annulus from the surrounding or ambient atmosphere, particularly where the two streams are of the same velocity, and therefore a center core of high pressure fluid reaches the tube 42 and produces an output signal.

It is apparent then that fluid must be applied to both of the nozzles 39 and 41 for the output passage 42 to receive a high pressure fluid, and in consequence, a coincidence circuit or and gate is provided.

What I claim is:

1. A fluid amplifier element comprising a power nozzle having an egress orifice adapted to issue a laminar power stream of fluid, at least two receiving ducts located downstream of, directed toward said power nozzle for receiving at least a portion of said power stream, said receiving ducts having ingress orifices which are coaxial with the egress orifice of said power nozzle, the distance between said power nozzle and at least one of said ingress orifices being such that said at least one ingress orifice receives a large proportion of said power stream, and a control nozzle adjacent the exit of said power nozzle and adapted to produce control fluid flow relative to said power stream to produce turbulence of the power stream and therefore independently vary the fluid of said power stream received by each of said ducts.

2. The fluid element of claim 1, wherein said control nozzle is concentric with said power nozzle and is adapted to issue a laminar stream of fluid.

3. The combination according to claim 2, wherein said control nozzle has an egress orifice located upstream of the egress orifice of said power nozzle such that a control fluid flow of an appropriate level is capable of producing turbulence in said power stream adjacent said egress orifice of said power nozzle.

4. The fluid element of claim 1, wherein the ingress orifices of said receiving ducts are concentrically disposed, the inner one of said ingress orifices being substantially the same size as the egress orifice of said power nozzle.

5. The fluid element of claim 4, wherein the receiving duct having the outer one of said ingress orifices comprises feedback means adapted to issue a feedback stream of fluid directed toward said power stream at a location upstream of the ingress orifices of said receiving ducts to increase turbulence of said power stream in response to initial turbulence produced by said control signal.

6. The fluid element of claim 5, wherein the receiving duct having the inner one of said ingress orifices comprises oscillator means adapted to issue a further stream of fluid for intermittently diverting of said feedback stream such that said feedback stream produces intermittent turbulence in said power stream.

7. The fluid element of claim 6, wherein the receiving duct comprising said feedback means includes a gap and the receiving duct comprising said oscillator means includes a wall means located adjacent its exit and extending towards said gap for causing boundary layer lock on of said further stream to said wall means when said further stream is below a predetermined velocity, such that said further stream attaches to said wall means to divert said feedback stream in said gap when said power stream is turbulent and produces no effect on said feedback stream when said power stream is laminar.

8. The combination according to claim 5 further comprising means for interrupting fluid flow to said power nozzle.

9. The combination according to claim 8, wherein said control nozzle comprises an outlet orifice of said feedback means.

10. The combination according to claim 5 further comprising means for selectively interrupting said feedback stream.

11. The fluid element of claim 1, wherein the ingress orifices of said receiving ducts are concentrically disposed, the outer one of said ingress orifices being substantially the same size as the egree orifice of said power nozzle.

12. A fluid amplifier element comprising a power nozzle adapted to issue a power stream having laminar flow, at least two concentric receiving ducts located downstream of, directed toward and coaxial with said power nozzle for receiving at least a portion of said power stream, said receiving ducts each having ingress orifices located downstream of said power nozzle, and a control nozzle adapted to release energy in response to a control signal for cooperation with said power stream, said energy causing turbulent flow in said power stream to control the amount of said power stream received by said ducts.

13. A fluid amplifier element comprising a power passage adapted to issue a laminar power stream of fluid, receiving duct means downstream of said power passage and directed toward said power passage for receiving at least a portion of said power stream and a control passage adjacent the exit of said power passage and concentric therewith, said control passage adapted to release energy in response to a control signal for creating turbulence in said power stream to control the amount of said power stream received by said duct.

14. The combination according to claim 13 wherein said control stream is a rotating fluid flow.

15. The combination according to claim 12 further comprising a vortex amplifier and means for supplying fluid from said vortex amplifier to said control passage.

16. A fluid switch comprising a turbulence amplifier having a power nozzle for issuing a laminar power stream, a control passage and a pair of receiving ducts, said ducts being concentric with each other and generally coaxial with said nozzle, an outer one of said ducts receiving fluid only when said power stream is turbulent and fluid feedback means for feeding back fluid received by said outer duct to a location adjacent said power stream upstream of said ducts to reenforce turbulence of said power stream.

17. A pure fluid counter stage comprising:

a supply passage having an egress orifice for issuing a substantially laminar first fluid stream;

a control passage concentric with said supply passage and having an egress orifice located upstream of the supply passage egress orifice for issuing laminar fluid count pulses of predetermined time duration, said fluid count pulses and said first fluid stream having substantially the same velocities;

a first receiving passage in axial alignment with said supply passage and spaced therefrom at a distance to receive said laminar first fluid stream;

a first feedback passage for conducting a portion of the fluid received by said first receiving passage upstream and for issuing said portion of the fluid adjacent the egress orifice of said control passage to produce turbulence in said fluid count pulses, said first feedback passage being of such a length that the time between reception of fluid at said first receiving passage and issuance of a portion of said fluid adjacent said control passage is greater than said predetermined time duration;

a second receiving passage positioned concentrically about said first receiving passage for receiving fluid only when either said first fluid stream or said fluid count pulses are turbulent;

a second feedback passage for conducting fluid received by said second receiving passage upstream and for issuing the fluid so conducted adjacent the supply passage egress orifice to produce turbulence in said first fluid stream, said second feedback passage being sufficiently short such that the time between reception of fluid at said second receiving passage and issuance of said fluid adjacent said supply passage is less than said predetermined time;

wherein the pressure in said first receiving passage increases and decreases with the occurrence of successive count pulses.

18. The device of claim 17 further comprising:

a third receiving passage positioned intermediate and coaxial with said first and second receiving passages, said third receiving passage receiving pressure pulses for each change in pressure at said first receiving passage.

19. A pure fluid oscillator comprising a supply nozzle for issuing a stream of fluid which remains substantially laminar over a predetermined distance;

an inner receiving passage coaxial with said supply nozzle and displaced therefrom so as to receive said stream of fluid in a slightly turbulent state;

an outer receiving passage concentrically disposed about said inner receiving passage;

a first feedback passage for conducting fluid received by said outer passage upstream and adjacent said stream of fluid to increase turbulence therein, said first feedback passage having a gap therein;

a second feedback passage communicating with said inner receiving passage and having an outlet orifice facing away from said gap and having a wall member extending from said outlet orifice towards said gap such that fluid above a predetermined pressure in said inner passage issues from said outlet orifice without affecting fluid in said gap and such that fluid therein below said predetermined pressure locks on to said wall member so as to divert fluid flowing in said gap;

wherein the pressure of the slightly turbulent stream received by said inner receiving passage produces a pressure above said predetermined pressure in said second feedback passage, and wherein the pressure received by said inner receiving passage when the turbulence of said stream is increased is below said predetermined pressure.

20. A proportional turbulence amplifier comprising a first passage for issuing when supplied with fluid at the proper Reynolds number a stream of fluid having laminar flow, a control passage located adjacent said first passage, said control passage adapted to issue variable fluid flows such that said stream of fluid becomes turbulent to a degree determined by the flow of fluid issued by said control passage, a first receiving passage located such as to receive said stream of fluid when laminar and for receiving proportions of the fluid of said stream which decrease as a function of increasing turbulence of said stream and a second receiving passage located such as to receive proportions of said stream which increase as a function of turbulent of said stream.

21. The combination according to claim 20 wherein said receiving passages are coaxial with one another.

22. The combination according to claim 21 wherein said receiving passages are coaxial with said first passage.

23. The combination according to claim 20 wherein said control passage is coaxial with said first passage.

24. A turbulence amplifier comprising a first passage for issuing when supplied with fluid at the proper Reynolds number a stream of fluid having laminar flow, a second passage substantially parallel to said first passage and located so as to issue a stream of fluid having laminar flow characteristics in contact with said first stream of fluid over an extended length thereof, means for varying the velocity of one of said streams to induce turbulence in said streams when the velocities of said streams differ by a predetermined factor, and an output passage located to receive a proportion of said stream when the flow of said streams is laminar.

25. The combination according to claim 24 wherein said means for varying comprises a vortex amplifier.

26. A turbulence amplifier comprising a first passage for issuing when supplied with fluid at the proper Reynolds number a stream of fluid having laminar flow characteristics, a second passage substantially parallel to said first passage and located so as to issue a stream of fluid having laminar flow characteristics in contact with said first stream of fluid over an extended length thereof, means for varying the velocity of one of said streams to induce turbulence flow characteristics in said streams when the velocities of said streams differ by a predetermined factor and means for monitoring the status of the flow characteristic of said streams.

27. A turbulence amplifier comprising:

first means for issuing a first substantially laminar stream of fluid;

second means for issuing a second substantially laminar stream of fluid such that the entire second stream is captured within said first stream and for inducing turbulence at the inner periphery of said first stream as a function of the relative velocities of said first and second streams;

means for receiving only laminar flow from said first and second streams; and output means for providing a fluid output signal as a function of the amount of turbulence induced in said first stream.

28. The turbulence amplifier of claim 27 wherein said first means comprises a first fluid passage terminating in a first nozzle adapted to issue said first substantially laminar stream, and wherein said second means comprises a second fluid passage positioned internally of said first fluid passage, said second fluid passage terminating in a second nozzle adapted to issue said second substantially laminar stream in the same direction as said first laminar stream.

29. The turbulence amplifier of claim 28 wherein said second nozzle is located sufficiently upstream of said first nozzle that for a given difference in stream velocities turbulence is induced in said first stream.

30. The turbulence amplifier of claim 28 wherein said means for receiving comprises a fluid receiving duct positioned substantially coaxial with said second nozzle and sufficiently close thereto so as to receive only laminar flow.

31. The turbulence amplifier of claim 30 wherein said output means comprises:

a first output duct positioned substantially concentrically about said fluid receiving duct and such that the pressure therein decreases with increasing turbulence of said first stream;

and a second output duct positioned substantially concentrically about said fluid receiving duct and such that the pressure therein increases with increasing turbulence of said first stream.

32. A coincidence circuit comprising an inner passage for issuing a laminar stream of fluid, an outer passage for issuing a laminar stream of fluid concentric with said inner passage, said passages having egress orifices adjacent one another, a receiver passage coaxial with said inner and outer passages and located downstream from said egress orifices by a distance such that fluid issued by only one of said inner and outer passages becomes turbulent before reaching said receiver passage and such that when fluid is issued by both said inner and outer passages simultaneously the fluid issued by said inner passage remains substantially laminar at said receiver passage, said first and second passages issuing fluid of approximately the same velocity.

33. A turbulence amplifier comprising:

means for issuing a pair of concentric fluid streams, one of said streams being substantially laminar, the other of said streams having a variable vortical flow rate component; and output means responsive to turbulence of said one stream for detecting vorticity in said other stream.

34. The combination according to claim 33 wherein means for issuing comprises:

a first passage for issuing said one stream;

an output passage of a vortex amplifier for issuing said other stream;

wherein said first and output passages are concentrically disposed.

35. The combination according to claim 34 wherein said output means comprises a receiving passage disposed downstream of said first passage for receiving at least a portion of said one stream.

36. The combination according to claim 34 wherein said output passage is disposed exteriorly of said first passage.

37. A fluid amplifier element comprising a power nozzle for issuing an initially laminar power stream, a first passage located downstream of and axially aligned with said power nozzle for receiving said laminar stream, control means for directing fluid toward said power stream to render said power stream turbulent between said power nozzle and said first passage and passage means for receiving the turbulent fluid of said power stream, said first passage having a longitudinal axis, said passage means being symmetrically positioned relative to said longitudinal axis of said first passage, said passage means and said first passage being located downstream of said power nozzle a distance such that when said stream is rendered turbulent by said control means, significant quantities of fluid are dispersed to regions lying on opposite sides of said axis of said first passage, said regions being located between said power nozzle and said first passage.

38. The combination according to claim 37 wherein the fluid ingress end of said passage means is generally transversely aligned with said first passage.

39. A fluidic amplifier comprising a supply passage for issuing a laminar stream of fluid, a receiving passage downstream of and axially aligned with said supply passage, said receiving passage normally receiving laminar flow, means for rendering said stream turbulent, means responsive to said stream becoming turbulent for maintaining said stream turbulent, and means for re-establishing laminar flow of said stream, said latter means including means for terminating flow of said stream from said supply passage.

40. A fluidic amplifier comprising a supply passage for issuing a stream of fluid which maintains a laminar flow characteristic for a predetermined length of flow from said supply passage after which said flow becomes turbulent and a receiving passage of a predetermined cross-sectional area axially aligned with said supply passage and located downstream of the point at which said stream flow becomes turbulent by a distance such that the stream has a small degree of initial turbulence at said location and control means for issuing a stream of fluid to induce further turbulence in said stream.

41. A turbulent amplifier AND gate comprising a first passage for issuing a turbulent stream of fluid, a second passage symmetrical with respect to said first passage for issuing a stream of fluid generally parallel to and in contact with said turbulent stream of fluid and a receiving passage located axially of said first passage and downstream a distance such as to receive a substantial amount of fluid only when both said first and second passages issue fluid.

42. The combination according to claim 41 wherein the width of said receiving passage is approximately equal to the width of said first passage.

43. The combination according to claim 41 wherein said passages are hollow cylinders, the diameter of said receiving passage is approximately equal to the diameter of said first passage and the diameter of said second passage is larger than the diameters of said other passages.

References Cited

UNITED STATES PATENTS

| | | | |
|---|---|---|---|
| 1,205,530 | 11/1916 | Hall. | |
| 1,628,723 | 5/1927 | Hall. | |
| 2,692,800 | 10/1954 | Nichols. | |
| 3,039,490 | 6/1962 | Carlson. | |
| 3,182,675 | 5/1965 | Zilberfarb. | |
| 3,234,955 | 2/1966 | Auger. | |
| 3,272,215 | 9/1966 | Bjornsen. | |
| 3,285,263 | 11/1966 | Bjornsen. | |
| 3,269,419 | 8/1966 | Dexter | 137—81.5 |
| 3,336,931 | 8/1967 | Fox et al. | 137—81.5 |
| 3,362,421 | 1/1968 | Schaffer | 137—81.5 |

FOREIGN PATENTS

| | | |
|---|---|---|
| 1,347,426 | 11/1963 | France. |
| 1,361,162 | 4/1964 | France. |

M. CARY NELSON, Primary Examiner

WILLIAM R. CLINE, Assistant Examiner